(12) United States Patent
Gautama

(10) Patent No.: US 9,331,650 B2
(45) Date of Patent: May 3, 2016

(54) AUDIO SYSTEM

(71) Applicant: NXP B.V., Eindhoven (NL)

(72) Inventor: Temujin Gautama, Leuven (BE)

(73) Assignee: NXP B.V., Eindhoven (NL)

( * ) Notice: Subject to any disclaimer, the term of this patent is extended or adjusted under 35 U.S.C. 154(b) by 254 days.

(21) Appl. No.: 14/090,659

(22) Filed: Nov. 26, 2013

(65) Prior Publication Data

US 2014/0146981 A1 May 29, 2014

(30) Foreign Application Priority Data

Nov. 29, 2012 (EP) ..................................... 12194814

(51) Int. Cl.
*H03G 3/00* (2006.01)
*H03G 3/30* (2006.01)

(52) U.S. Cl.
CPC ............... *H03G 3/00* (2013.01); *H03G 3/3005* (2013.01)

(58) Field of Classification Search
CPC .................................. H03G 3/005; H03G 3/00
USPC ......................................................... 381/107
See application file for complete search history.

(56) References Cited

U.S. PATENT DOCUMENTS

| | | | |
|---|---|---|---|
| 4,457,020 A | 6/1984 | King | |
| 6,374,095 B1 * | 4/2002 | Doyle | H03G 3/344 455/212 |
| 2008/0219332 A1 | 9/2008 | Brehler | |

FOREIGN PATENT DOCUMENTS

| | | |
|---|---|---|
| EP | 0 703 708 A2 | 3/1996 |
| EP | 0 917 286 A2 | 5/1999 |

OTHER PUBLICATIONS

Extended European Search Report for Patent Appln. No. 12194814.5 (May 2, 2013).

* cited by examiner

*Primary Examiner* — Paul S Kim
(74) *Attorney, Agent, or Firm* — Rajeev Madnawat

(57) ABSTRACT

An audio system includes a channel (10) for processing signals. The channel (10) includes a processing module (50) that follows a chain of modules (40) wherein the chain (40) includes a preceding processing module (45). The following processing module (50) is coupled to the preceding processing module (45) in the chain of modules (40) for receiving the output signal (25). The channel (10) further includes a combiner (60). The combiner (60) has two inputs, a first input (65) receives the signal (30) to be processed in the channel (10), and a second input (70) receives a reference signal (75). The combiner (60) further includes an output (80) coupled to an input of the preceding processing module (45) in the chain (40). By coupling a combination of the signal (30) to be processed and the reference signal (75) to the input (55) of the preceding processing module (45) in the chain (40) and by having a correction signal (90) from the processing unit (85) generated in response to a modification of the reference signal (75) in the output signal (25) of the preceding processing module (45) in the chain (40), the amount and type of processing in the preceding processing module (45) in the chain (40) can be estimated in the processing unit (85) and be corrected for in the following processing module (50).

13 Claims, 6 Drawing Sheets

AUDIO SYSTEM

CROSS-REFERENCE TO RELATED APPLICATIONS

This application claims the priority under 35 U.S.C. §119 of European patent application no. 12194814.5, filed on Nov. 29, 2012, the contents of which are incorporated by reference herein.

FIELD OF THE INVENTION

The invention relates to an audio system and to a method for processing signals in such audio system.

BACKGROUND ART

Audio systems are systems used for processing audio signals. Usually the signal processing is performed by one or more modules that form an audio chain. When the system combines more than one module, it can be the case that the effect of a first module needs to be known by a subsequent module in the chain.

An example of such a system has a module that applies an attenuation factor to a signal, followed by another module that brings the signal back to full scale amplitude. Typically, the first module is a volume control module and the second one is an Automatic Gain Control (or AGC) module.

Although in the design of audio systems this configuration is not preferred, sometimes it cannot be avoided. There are cases in which separate modules are implemented in different hardware components. In this case there is no freedom to arrange the modules for the most preferred configuration. As a consequence a control mechanism is required to resolve the conflicts. This control mechanism retrieves information from certain modules and sends it to other modules.

In the above example, information corresponding to the gain change of the volume control module needs to be sent to the Automatic Gain Control (AGC) module so that this change is not counteracted by the AGC. This requires that the two modules communicate with each other by means of an external control mechanism.

When the audio system combines many modules, the required control mechanism can make the integration phase more complex.

SUMMARY OF THE INVENTION

It is an object of the present invention to at least diminish the disadvantages of the known audio systems.

According to the invention, this object is achieved by an audio system including a channel for processing signals, the channel comprising:
  a preceding processing module,
  a following processing module being coupled to the preceding processing module for receiving an output signal from the preceding processing module,
  a combiner having a first input for receiving a signal to be processed by the channel, a second input for receiving a reference signal and having an output coupled to an input of the preceding processing module, and
  a processing unit for receiving the output signal, wherein the processing unit is configured for generating a correction signal in response to a modification of the reference signal in the output signal and wherein the following processing module is configured for changing a processing of the following processing module in response to the correction signal.

By coupling a combination of the signal to be processed and the reference signal to the input of the preceding processing module and by having a correction signal from the processing unit generated in response to a modification of the reference signal in the output signal of the preceding processing module, the amount and type of processing in the preceding processing module can be estimated in the processing unit and be corrected for in the following processing module.

The audio system may comprise at least one further channel wherein the reference signal is the same for each further channel. In this way the amount and type of processing in the preceding processing module can be estimated for each channel separately. The estimation result for each channel can be then compared (e.g., to see whether or not the same gain has been applied to each further channel).

Alternatively, the reference signal may be different for each further channel. In that case it can be estimated whether or not any mixing has been performed or cross-talk is present between channels.

In another embodiment, the reference signal may be a sine wave of a predetermined frequency and the audio system may further comprise a filter used to attenuate frequency components of the signal to be processed corresponding to an integer multiple of the predetermined frequency. In this way distortions can be observed at frequency components that are at integer multiple of the predetermined frequency (harmonic distortions).

Similarly in another embodiment, the reference signal may be a multi-frequency components signal and the audio system may further comprise a filter used to attenuate the frequency components of the signal to be processed corresponding to the integer multiple, sum and difference of any integer multiple of the reference signal's multi-frequency components. In this way also intermodulation distortions can be observed.

In both preceding examples the non-linear processing of the preceding processing module may be estimated by looking only at the reference signal in the output signal. According to another aspect of the invention there is provided:

A method of processing audio signals in an audio system having a series of processing modules, the method comprising:
  combining a signal to be processed by the series of processing modules with a reference signal to obtain a combined signal,
  processing the combined signal in a preceding processing module to obtain an output signal,
  processing the output signal in a following processing module in the series of processing modules,
  generating a correction signal in response to a modification of the reference signal in the output signal, and
  changing a processing of the following processing module in response to the correction signal.

BRIEF DESCRIPTION OF THE DRAWINGS

These and other aspects of the invention will be apparent from and will be elucidated with reference to the embodiments described hereinafter. In the drawings.

DETAILED DESCRIPTION OF EMBODIMENTS

Figure 1:
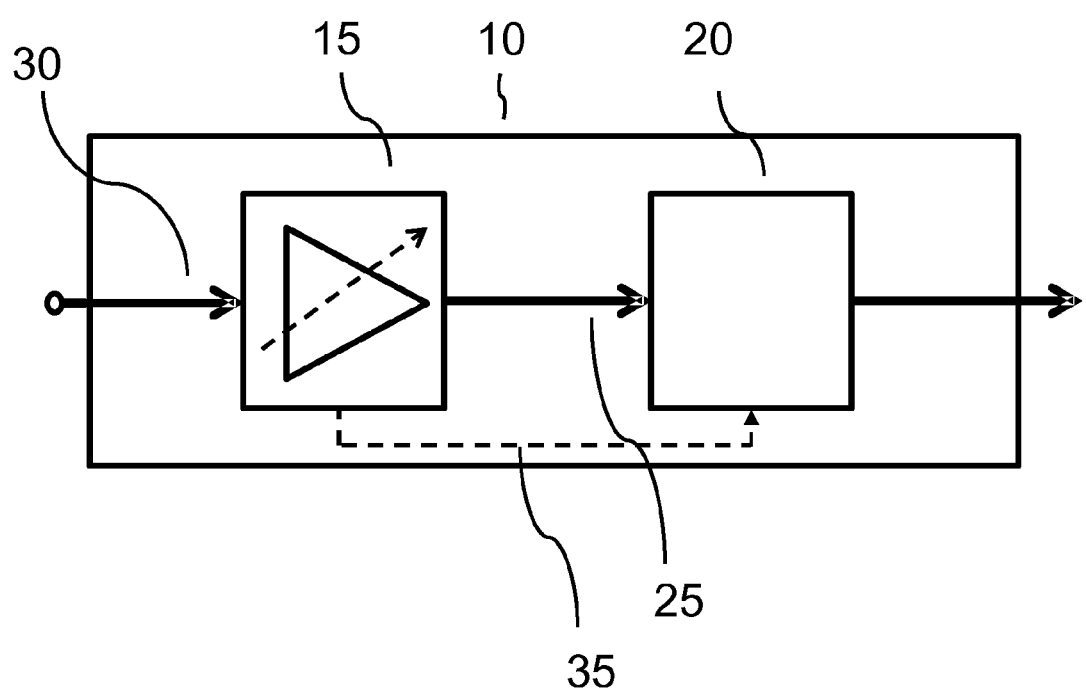
FIG. 1 shows an audio system comprising a volume control module and Automatic Gain control (AGC) module.

FIG. 1 shows an example of an audio system. This audio system has a channel 10 for processing signals. In this channel 10 a processing module 20 follows a volume control module 15. The channel 10 processes a signal 30 which enters the volume control module 15 which applies a gain to the signal 30 and provides an output signal 25 to the following processing module 20. The volume control module 15 is implemented on a first (mechanically separated hardware) component (not shown in FIG. 1). The processing module 20 may be an AGC (Automatic Gain Control) stage implemented on a second (hardware) component (also not shown in FIG. 1). In this example, the applied gain change of the volume control module 15 should be sent to the processing module 20, so that a gain change is not counteracted by the AGC. This requires a control mechanism 35 (dashed arrow line going from module 15 to module 20) to retrieve the gain information from the volume control module 15 and send it to the processing module 20. Alternatively to the discussed volume control module, the module 15 may perform any other processing on the signal 30 leading to an output signal 25 which differs from the signal 30.

Figure 2:
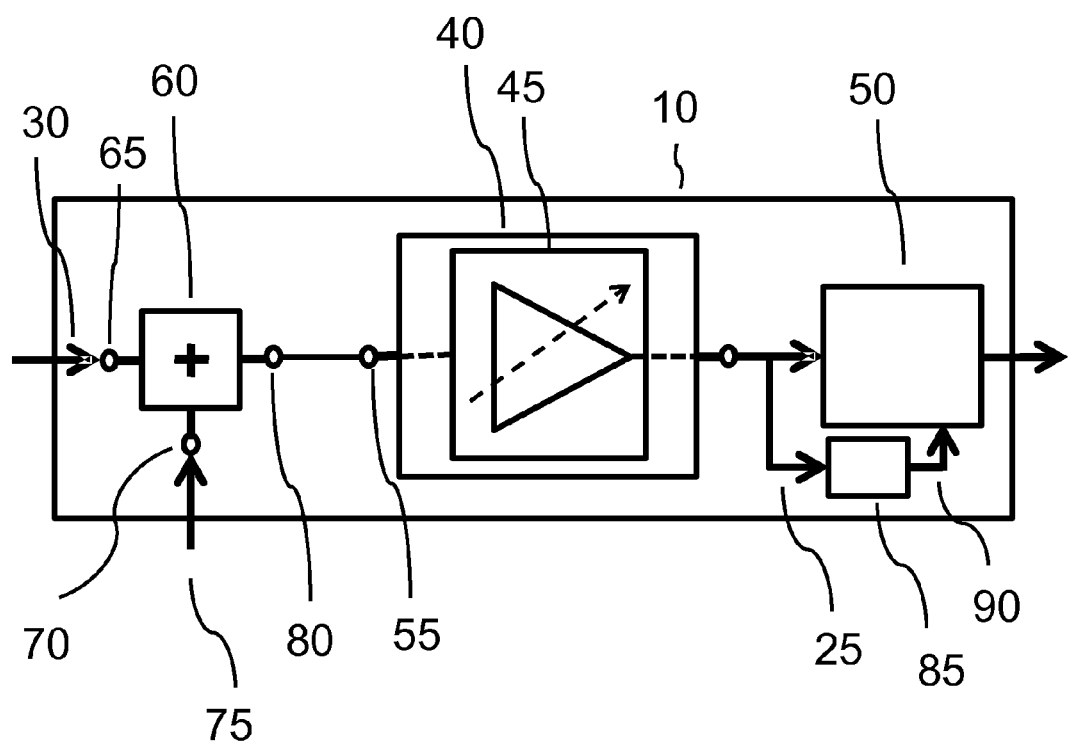
FIG. 2 shows a first example of an audio system according to the invention.

FIG. 2 shows an example of an audio system according to the invention. The audio system includes a channel 10 for processing signals. The channel 10 may include a chain of modules 40. The chain of modules 40 contains a preceding processing module 45, which by way of example, is the same volume control module 15 as shown in FIG. 1. The chain of modules 40 may contain a plurality of processing modules connected in series (as indicated by dashed lines on both sides of the preceding processing module 45). Alternatively the chain of modules 40 may be replaced by a single module. FIG. 2 further shows a following processing module 50, which, by way of example, is the same AGC module 20 of FIG. 1. The AGC-module in the following processing module 50 is coupled to the chain of modules 40 for receiving an output signal 25 from the preceding processing module 45 in the chain of modules 40. The channel 10 further includes a combiner 60. The combiner 60 has two inputs, a first input 65 receives the signal 30 to be processed in the channel 10, and a second input 70 receives a reference signal 75. The combiner 60 further includes an output 80 coupled to an input 55 of the preceding processing module 45 in the chain 40. The combiner 60 may be an adder as indicated in FIG. 2 or may subtract the signal 30 to be processed and the reference signal 75. The channel 10 further includes a processing unit 85 for receiving the output signal 25. The processing unit 85 supplies a correction signal 90 to the following processing module 50. The processing unit 85 may be also located in a different position than the position shown in FIG. 2. It may for example be integrated in the following processing module 50 or be placed anywhere else in the audio system.

In the example of FIG. 2 the type and the extent of the processing occurring between the input 55 and the output of the chain 40, can be estimated without the need of the control mechanism 35 shown in FIG. 1. Indeed, because the combined signal is processed, the effect will be visible both on the signal 30 and on the reference signal 75. It is therefore possible to deduct information on the processing of the preceding processing module 15 (or the series of processing modules contained in the chain 40) by examining the reference signal in the processed combined signal or output signal 25. Consequently, it is not required to use the control mechanism 35 of FIG. 1. If the combiner 60 is an adder, the combined signal is the signal 30 to be processed added to the reference signal 75. The omission of the control mechanism 35 is also obtained for other classes of the preceding processing module 45 (or the series of processing modules contained in the chain 40): for example automatically adapting or fixed gain stages, dynamic range compressors, etc.

If the reference signal 75 is a sine wave, which is preferably chosen with low amplitude and at low frequency (e.g. outside a normal hearing frequency range), the extent of the processing can be estimated by estimating the amplitude of the reference signal 75. The estimation is performed by the processing unit 85 which feeds a correction signal 90 to the following processing module 50. There exist many methods in the literature to do this, e.g., by observing the Fast Fourier Transform (FFT) spectrum or by computing the Discrete Fourier Transform (DFT) at the frequency of the reference signal 75. The gain that has been applied by the volume control module in the preceding processing module 45 (or by the series of processing modules contained in the chain 40), can be computed as the ratio between the estimated amplitude of the reference signal 75 in the output signal 25 and the expected amplitude in absence of processing, i.e., the original amplitude of the reference signal 75. This approach can yield a very accurate estimate of the gain that has been applied for the above mentioned class of preceding processing modules.

Figure 3:
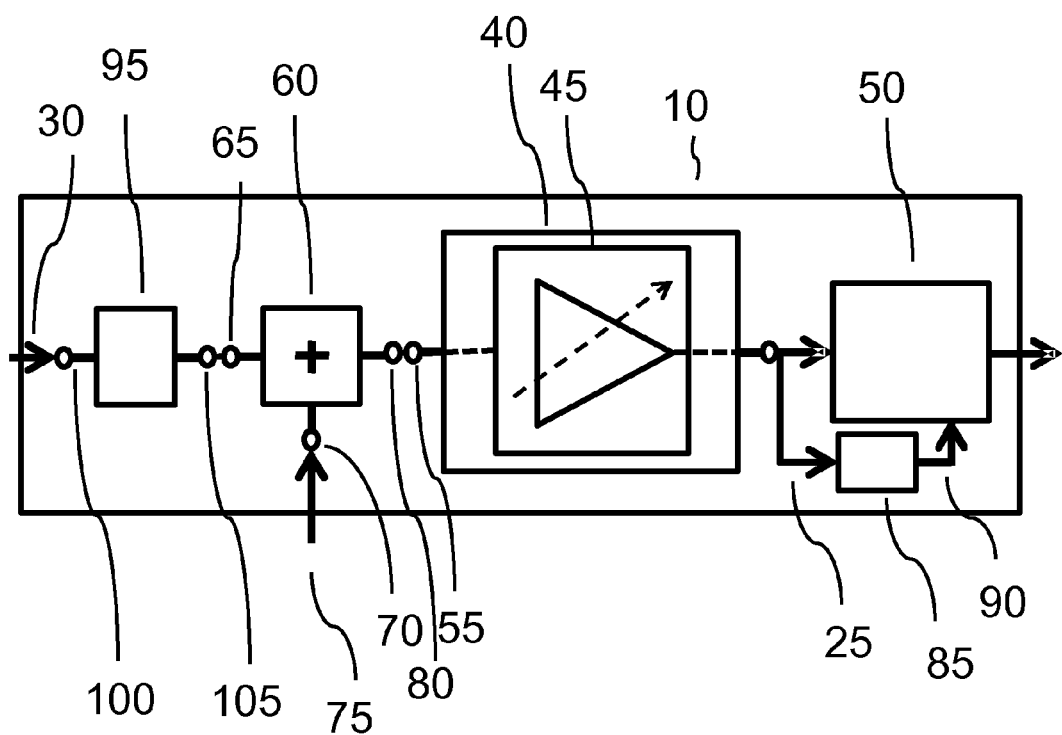
FIG. 3 shows a second example of an audio system according to the invention.

FIG. 3 shows a further example of an audio system according to the invention. This audio system is similar to the audio system of FIG. 2, except that a filter 95 is added. The filter 95 has an input 100 for receiving the signal 30 to be processed and an output 105 that is coupled to the input 65. This audio system is able to detect the presence of non-linear processing (such as clipping) in the volume control module in the preceding processing module 45 (or in the series of processing modules contained in the chain 40). In case of non-linear processing, the reference signal will also be processed in a nonlinear way, leading to non-linear distortions.

If the reference signal 75 is a sine wave at frequency $f_1$ (also in this case preferably chosen with negligible amplitude), the distortions can be observed at frequency components that are at integer multiple of the original frequency $f_1$: $f_{eval}=f_1+k\ f_1$, where k is a strictly positive integer. The frequency components of $f_{eval}$ are called harmonic distortions. Therefore in this case the presence and the extent of non-linear processing can be determined by observing the amplitudes of the harmonic distortions at the set of frequency $f_{eval}$ for a limited set of values k. In order to estimate the harmonic distortions of the sine wave, the corresponding frequency components in the signal 30 need to be attenuated in the filter 95. The filter 95 may for example be a notch filter, selectively filtering the frequency components where harmonic distortions are expected.

If the reference signal 75 is a sum of two sine waves, each one at different frequency (i.e. $f_{ref\_signal}=f_1+f_2$), the filter 95 needs to attenuate a set of frequency components that are an integer multiple (harmonic distortions), a sum and a difference of any integer multiple of the reference signal's frequency components (so-called intermodulation distortions) $f_{ref\_signal}$ (i.e. $f_{eval}=nf_1+k\ f_2$, wherein n and k are integers). In this case the presence and the extent of non-linear processing can be determined by observing the amplitudes of the distortion components (harmonic and intermodulation distortions) at the set of frequency $f_{eval}$ for a limited set of values of n and k.

If the reference signal 75 is a signal having multi-frequency sine wave components, e.g., it is a signal that is the sum of multi-frequency sine waves, each one at frequency $f_i$, the filter needs to attenuate all those frequency components that are an integer multiple of each frequency $f_i$ and a sum and a difference of any integer multiple of each frequency $f_i$.

Figure 4:
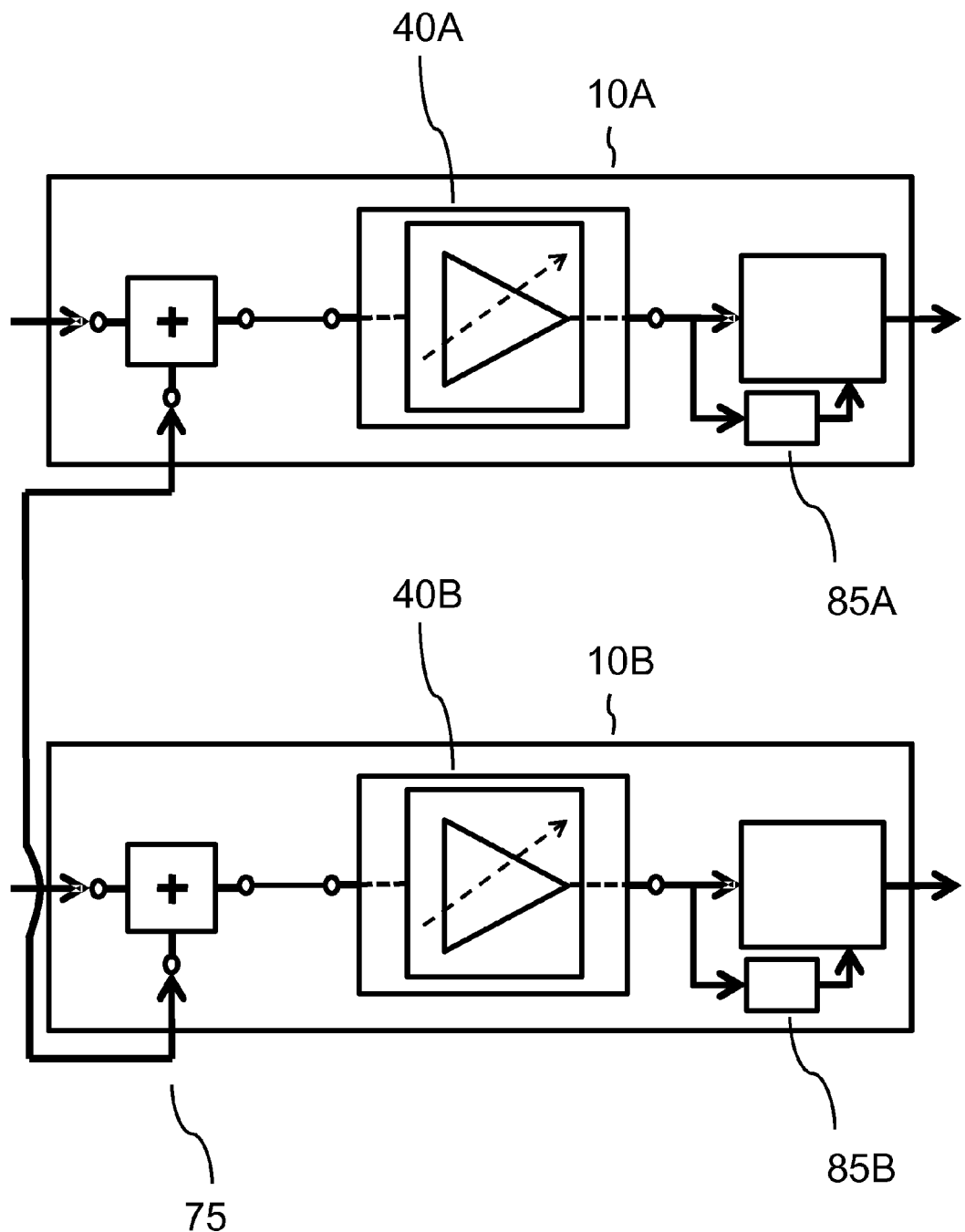
FIG. 4 shows a first example of a dual-channel audio system according to the invention.

FIG. 4 shows a further example of an audio system according to the invention. The audio system includes a further channel which is a dual channel version of the example shown in FIG. 2. Suffix A is added to the reference numerals of the first channel 10A and suffix B is added to the reference numerals of the second channel 10B. In this example the reference signal 75 is the same for both channels 10A and 10B. In this case, the extent and type of processing of the processing modules in the chains 40A and 40B can be estimated for each channel 10A and 10B separately. The estimation of the processing can be then compared at the corresponding processing units 85A and 85B, e.g. to see whether or not the same gain has been applied to each of the two channels.

Figure 5:
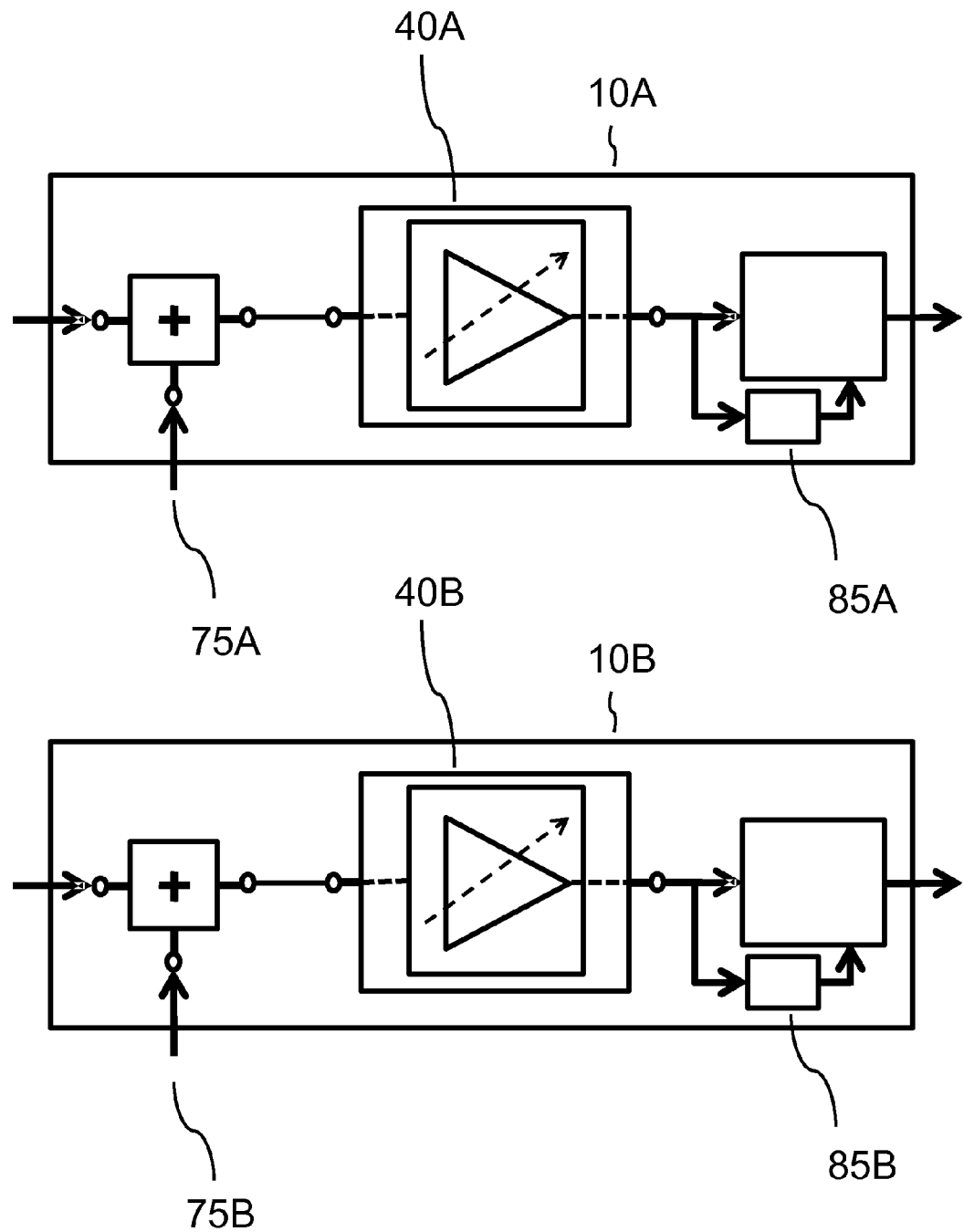
FIG. 5 shows a second example of a dual-channel audio system according to the invention.

Another alternative is to choose different reference signals 75A and 75B (e.g., sine waves of different frequencies) for each channel as shown in FIG. 5. In this case the extent and type of processing of the processing modules in the chains 10A and 10B can also be estimated for each channel separately and estimation results can be compared. Further to that in the specific example of FIG. 5, it can be assessed whether or not any mixing has been performed or cross-talk is present between channel 10A and channel 10B, in which case a sine wave of channel 10A would be for example present in the channel 10B or vice versa.

The examples given in FIG. 4 and FIG. 5 may actually be extended to a multi-channel audio system, wherein the audio system includes more than a further channel 10B (e.g., also 10C, 10D, etc.).

In the multi-channel examples shown in FIG. 4 and FIG. 5, a filter similar to the filter 95 as shown in FIG. 3 may be added to each channel for the same purpose as described above in the example of FIG. 3.

Finally the single- or multi-channel output signal can be filtered in such a way that the reference signal and distortion components are removed. This step (also not shown in any of the Figures) may not be necessary if the reference signals and their distortion components are chosen outside of the normal hearing range.

Figure 6:
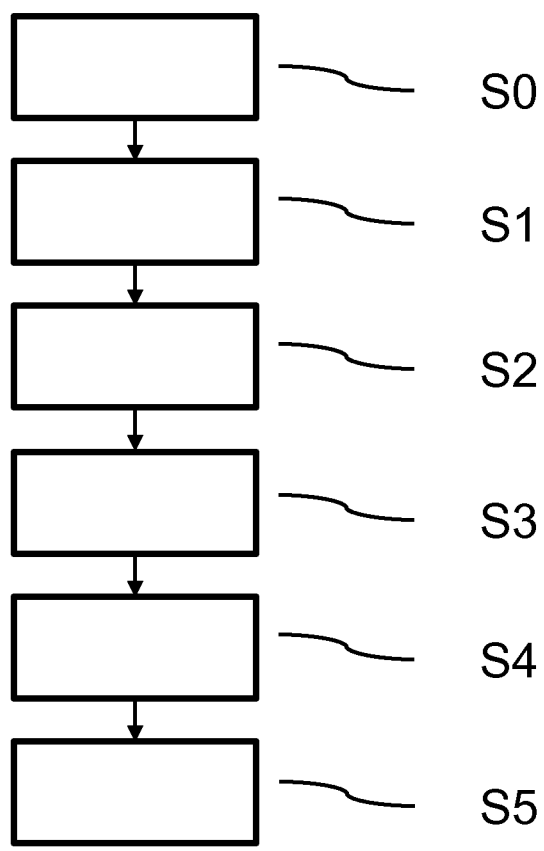
FIG. 6 shows a flowchart illustrating a method of processing audio signals in an audio system.

FIG. 6 shows a flowchart illustrating a method of processing audio signals in an audio system including the following steps. In step S1 a signal 30 to be processed by the series of processing modules is combined with a reference signal 75 to obtain a combined signal. In step S2 the combined signal is processed in a preceding processing module 45 to obtain an output signal 25. In step S3 the output signal 25 is processed in a following processing module 50 in the series of processing modules. In step S4 a correction signal 90 is generated in response to a modification of the reference signal 75 in the output signal 25. In step S5 a processing of the following processing module 50 is changed in response to the correction signal 90. In step S0 an optional filter 95 is applied to obtain the signal 30 from an input signal The present invention can be applied in audio systems where the processing is distributed across different components. Especially in components near the end of the audio chain (e.g., audio amplifiers) that include a DSP (Digital Signal Processing) with audio processing, it is important to know what processing has been performed earlier, so that none of that processing is counteracted.

The invention claimed is:

1. An audio system including a channel for processing signals, the channel comprising:
    a preceding processing module, wherein the preceding processing module comprises a volume control module;
    a following processing module being coupled to the preceding processing module configured to receive an output signal from the preceding processing module, wherein the following processing module comprises an automatic gain control module;
    a combiner having a first input configured to receive a signal to be processed by the channel, a second input configured to receive a reference signal, and an output coupled to an input of the preceding processing module; and
    a processing unit configured to receive the output signal, wherein the processing unit is configured to generate a correction signal in response to a modification of the reference signal in the output signal and the following processing module is configured to change a processing of the following processing module in response to the correction signal.

2. The audio system according to claim 1, further comprising:
    at least one further channel, wherein the reference signal is identical for each further channel.

3. The audio system according to claim 1, further comprising:
    at least one further channel, wherein the reference signal is different for each further channel.

4. The audio system according to claim 1, further comprising:
    a filter having an input configured to receive the signal to be processed by the channel and having an output coupled to the first input.

5. The audio system according to claim 4, wherein the reference signal is a sine wave of a predetermined frequency and the filter is designed for attenuating frequency components that are an integer multiple of the predetermined frequency.

6. The audio system according to claim 4, wherein the reference signal is a signal having multi-frequency components and the filter is designed for attenuating frequency components that are an integer multiple, a sum, and a difference of any integer multiple of the multi-frequency components.

7. The audio system according to claim 1, wherein the reference signal is a sine wave.

8. The audio system according to claim 1 wherein the reference signal is a signal having multi-frequency sine wave components.

9. The audio system according to claim 6 wherein the signal having multi-frequency components is a signal having multi-frequency sine wave components.

10. The audio system according to claim 4, wherein the filter is a notch filter.

11. A digital signal audio processing system comprising the audio system according to claim 1.

12. A method of processing audio signals in an audio system having a series of processing modules, the method comprising:
    combining a signal to be processed by the series of processing modules with a reference signal to obtain a combined signal;

processing the combined signal in a preceding processing module, wherein the preceding processing module comprises a volume control module, to obtain an output signal;

processing the output signal in a following processing module, wherein the following processing module comprises an automatic gain control module, in the series of processing modules;

generating a correction signal in response to a modification of the reference signal in the output signal; and changing a processing of the following processing module in response to the correction signal.

13. A digital signal audio processing system working according to the method of claim 12.

* * * * *